United States Patent
Price et al.

(10) Patent No.: US 7,795,120 B1
(45) Date of Patent: Sep. 14, 2010

(54) DOPING WIDE BAND GAP SEMICONDUCTORS

(75) Inventors: Jack L. Price, Derwood, MD (US); Noel A. Guardala, Columbia, MD (US); Michael G. Pravica, Henderson, NV (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 12/560,622

(22) Filed: Sep. 16, 2009

Related U.S. Application Data

(60) Provisional application No. 61/237,716, filed on Aug. 28, 2009.

(51) Int. Cl.
*H01L 21/261* (2006.01)

(52) U.S. Cl. ............ 438/512; 438/520; 438/522; 257/E21.344

(58) Field of Classification Search ............ 438/512, 438/520, 522
See application file for complete search history.

(56) References Cited

U.S. PATENT DOCUMENTS

| 6,100,168 A | 8/2000 | Liao et al. |
| 6,114,225 A | 9/2000 | Liao et al. |

OTHER PUBLICATIONS

Michael G. Pravica, Noel A. Guardala and Jack L. Price, A novel method to dope diamond-Ion Beam Nuclear Transmutation Doping (IBNTD), Diamond 2008 Conference, Sitges, Spain, Sep. 7-11, 2008.

*Primary Examiner*—Alexander G Ghyka
(74) *Attorney, Agent, or Firm*—Richard A. Morgan

(57) ABSTRACT

A $^{13}$C diamond is doped by proton induced transmutation. P-type doping is achieved by the $^{13}$C(p,αγ)$^{10}$B reaction. N-type doping is achieved by the $^{13}$C(p,γ)$^{14}$N reaction. The transmutation reaction that occurs is determined by selection of proton beam energy. Stacks of junctions each calculated to be in the order of 10 nm thick have been achieved.

2 Claims, 1 Drawing Sheet

DOPING WIDE BAND GAP SEMICONDUCTORS

STATEMENT OF GOVERNMENT INTEREST

The invention described herein may be manufactured and used by or for the Government of the United States of America for governmental purposes without the payment of any royalties thereon or therefor.

CROSS-REFERENCE TO RELATED APPLICATION

Not Applicable.

BACKGROUND OF THE INVENTION

1. Field of the Invention

The invention relates to a method of manufacturing a semiconductor device. More particularly, the invention relates to a method of introducing a conductivity modifying dopant into a semiconductor material. Most particularly, the invention relates to proton beam transmutation doping.

2. Discussion of the Related Art

Wide band gap semiconductor materials such as diamond, SiC, AlN, AlGaN, GaN, GaP, $Al_2O_3$ and AlAs are of continuing interest for use in semiconductor products. However, their full potential has not been realized because of the difficulty in doping to activate them for use.

Conventional methods of doping methods, such as ion implantation and thermal diffusion are difficult to implement in wide band gap materials because of the rigid, high strength lattice structure. The lattice structure reduces the replacement of lattice atoms with dopant atoms to a small fraction. In the case of interstitial doping, the substrate suffers significant damage. Annealing is required to heal the damage, resulting in migration and loss of interstitial dopant atoms. Substitution doping is preferred over interstitial doping for electrical reliability of the semiconductor over time and over a temperature range.

Neutron transmutation doping (NTD) creates radioactive species which must be isolated until the induced radioactivity diminishes to safe levels. Also, neutrons are extremely penetrating and electrically neutral, so neutron transmutation doping dopes the entire lattice by using neutrons of varying energies.

Chemical vapor deposition (CVD) may be applied for doping wide band gap materials. However, the control of gas, chemical reactions and incorporation into the lattice limits the doping layer thickness and quality.

These methods have been tried for creating p-type boron doped diamond. One of the outstanding challenges in doping wide band gap materials is the creation of n-type diamond. Diamond has excellent properties including high breakdown voltage, high electron and hole mobility and high thermal conductivity. These properties indicate that it has potential for use in semiconductor applications.

These and other problems of doping high band gap semiconductor materials are solved, at least in part, by the proton beam transmutation doping method of the invention.

SUMMARY OF THE INVENTION

A method of doping a wide band gap semiconductor material has been discovered. The method comprises selecting a wide-band gap semiconductor material. A beam of protons is directed onto the selected material at an energy in the range of 0.5 to 4.0 Mev, and for a time sufficient to form a junction. The product is then annealed to form a doped semiconductor.

DETAILED DESCRIPTION OF THE INVENTION

Figure 1:
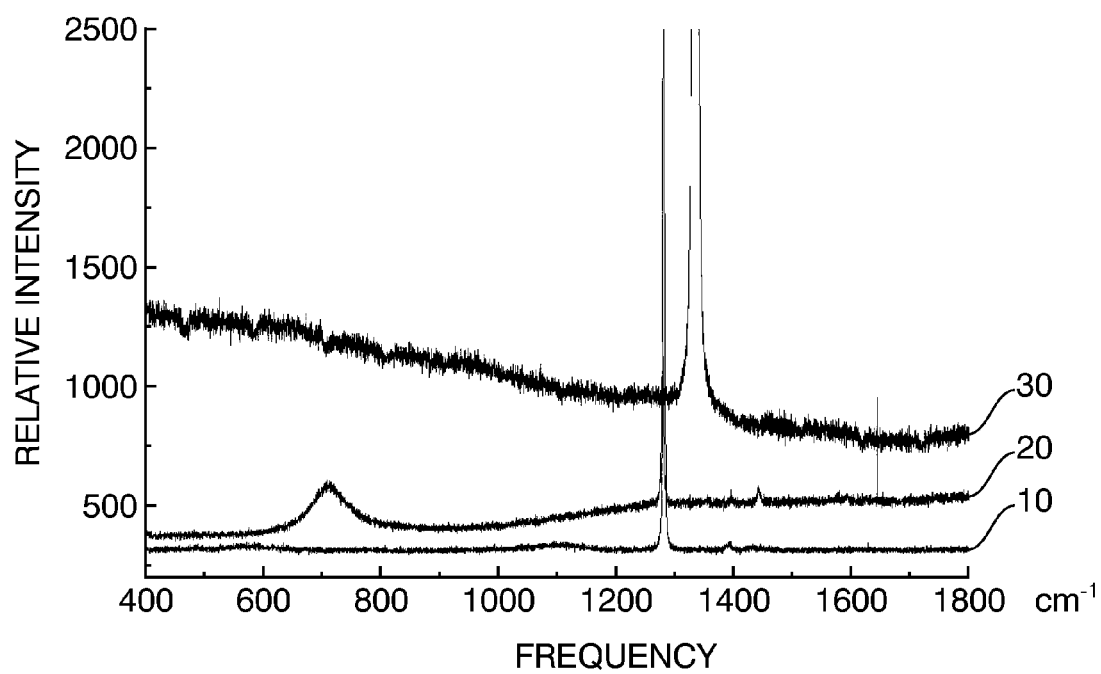
FIG. 1 is a plot of three Raman spectra.

The invention is a method of doping a wide band gap semiconductor material by proton nuclear transmutation. Wide band gap semiconductors are those having a band gap of 1.7 eV or greater. The semiconductors of particular interest are those having a transmutatible atom in the crystal lattice. These include aluminum (Al), carbon (C), nitrogen (N), silicon (Si), and phosphorous (P).

The wide band gap semiconductors of commercial interest include diamond (C), silicon carbide (SiC), gallium phosphorous (GaP), gallium nitride (GaN), aluminum nitride (AlN), aluminum gallium nitride (AlGaN), aluminum arsenide (AlAs) and boron nitride (BN). In addition, there are many Group III-Group V compounds and Group II-Group VI compounds having high band gaps. Group IV elemental semiconductors include diamond (C), silicon (Si) and germanium (Ge).

The flow of protons is directed at the selected host semiconductor crystalline material. Transmutatable atomic nuclei in the crystal lattice capture protons and are thereby increased or decreased in atomic weight. A nucleus increased in atomic weight is referred to as n-type. A nucleus decreased in atomic weight is referred to a p-type. The resulting nucleus is thereby doped. The effect of doping is to convert some of the atoms in the crystal lattice to conductive junctions.

The flow of protons required to dope the semiconductor material depends entirely on the atomic nuclei in the crystalline lattice. A partial list of the reactions of interest is listed in TABLE 1.

TABLE 1

| Nuclear Reaction | Capture Energy | Doping Type |
| --- | --- | --- |
| $^1H + {}^{27}Al \rightarrow {}^{28}Si + \gamma$ | $E_R$ = 992, 1368 keV | n-type |
| $^1H + {}^{27}Al \rightarrow {}^{28}Mg + {}^4He + \gamma$ | $E_R$ = 1183 keV | p-type |
| $^1H + {}^{13}C \rightarrow {}^{14}N + \gamma$ | $E_R$ = 1748 keV | n-type |
| $^1H + {}^{13}C \rightarrow {}^{10}B + {}^4He + \gamma$ | $E_R$ = 702, 1740 keV | p-type |
| $^1H + {}^{15}N \rightarrow {}^{16}O + \gamma$ | $E_R$ = 1210, 1650, 3000 keV | n-type |
| $^1H + {}^{15}N \rightarrow {}^{12}C + {}^4He + \gamma$ | $E_R$ = 897, 3000 keV | p-type |
| $^1H + {}^{30}Si \rightarrow {}^{31}P + \gamma$ | $E_R$ = 620 keV | n-type |
| $^1H + {}^{31}P \rightarrow {}^{32}S + \gamma$ | $E_R$ = 1251 keV | n-type |
| $^1H + {}^{31}P \rightarrow {}^{28}Si + {}^4He + \gamma$ | $E_R$ = 1521 keV | p-type |

$^1$H is a proton.
$^4$He is a helium nucleus, i.e. an alpha particle comprising two protons and two neutrons.
γ is a gamma-ray.
$E_R$ is the resonance energy for radiative capture.

Proton beam transmutation doping has advantages over neutron capture induced doping. First, protons are charged particles and therefore have significant values of kinetic energy loss with distance penetrated into the material. As a result, precise proton beam energies can be selected to allow doping at depths based on the initial beam energy and energy loss (dE/dx) due to the distance traversed by protons through the semiconductor crystal until they reach the nuclear resonance energy. The separation of junctions in the stack of junctions is dependent on the characteristic energy loss of the protons through the material, i.e. dE/dx. Second, protons are much smaller than ion dopants, such as phosphorus. Therefore, protons cause much less collision induced damage to the lattice in the transmutation layer than ion dopants.

Attention is drawn to the doping reaction for the wide band gap semiconductor material, gallium nitride (GaN), $$^{1}H + {}^{15}N \rightarrow {}^{12}C + {}^{4}\alpha + \gamma.$$

Resonances occur at a number of energies. The strongest are near 3.3 MeV, 3.0 MeV, 1.985 MeV, 1.65 MeV, 1.21 MeV, 0.897 MeV and 0.429 MeV. The doping reaction is initiated by directing a flow of protons onto a face of the gallium nitride (GaN) crystal at a proton beam energy of 3.3 MeV. This dopes a p-type layer on the surface. As the proton beam penetrates the crystal, beam energy is lost with distance (dE/dx) as the protons slow. At each resonance energy, protons slowed to the transmutation reaction energy are captured by a nitrogen nucleus. A p-type layer is produced by transmutation of the nitrogen nucleus ($^{15}N$) to a carbon nucleus ($^{12}C$). Thus proton transmutation doping of gallium nitride (GaN) produces a stack of p-type junctions, one at each energy level. The physical distance between the p-type junctions is determined by the energy decay with distance (dE/dx) through the semiconductor material. That energy consumption is a physical property of the material. If the starting material is an n-doped gallium nitride (GaN) crystal, the resulting material can contain both p-type and n-type junctions.

Attention is drawn to a reaction for p-type doping of gallium nitride (GaN), $$^{1}H + {}^{15}N \rightarrow {}^{16}O + \gamma.$$

The resonance frequencies of this reaction are much broader than for the reaction of $^{15}N$ to $^{12}C$. The resulting material has lower cross sections. This reaction is distinguished from the reaction using a phosphorous semiconductor material as a starting material. Both p-type and n-type doping of a phosphorous semiconductor material is possible.

Diamond is a particularly challenging high band gap semiconductor material because of the difficulty in doping the material to create conductive junctions. A method has been found to create an n-type diamond semiconductor. High energy proton beams have been used to convert a small fraction of the carbon nuclei in diamond. A high energy proton beam has an initial energy in the range of 0.5 to 4 MeV. A nuclear accelerator is used to produce a flow of protons, essentially hydrogen and helium nuclei, stripped of electrons.

Attention is drawn to the doping reaction for diamond, $$^{1}H + {}^{13}C \rightarrow {}^{14}N + \gamma.$$

The reaction has resonance energy of 1.748 MeV and a high cross section and narrow resonance width of 75 eV. Proton transmutation doping allows for doping a very narrow layer of substrate with relatively high efficiency. However, nitrogen doped diamond has limited use due to 1.7 eV, deep level donors within the nitrogen gap. Other reactions are available to dope diamond such as $$^{1}H + {}^{13}C \rightarrow {}^{10}B + {}^{4}He + \gamma.$$

This reaction has resonance energies of 0.72 and 1.74.

A considerable advantage of the doping method of the invention is that crystal damage in the semiconductor material is considerably reduced compared to ion beam doping. This is due to the relatively low mass of the proton compared with mass of an ion. The crystal lattice adsorbs much of the momentum of proton bombardment. This is not the case with ion bombardment. The precision and wide range of beam energy selection allows for narrow layers of p-type or n-type junctions in the material at precise and predictable depths. This is distinguished from neutron transmutation doping in which there is no energy loss with distance (dE/dx) and therefore no depth control.

In addition, there is much less damage of the crystal. As a result, less severe annealing methods can be used. Annealing at lower temperatures for reduced time periods reduces the dopant loss to thermal diffusion from the junction.

This invention is shown by way of Example.

Example 1

We carried out the doping reaction for diamond, $$^{1}H + {}^{13}C \rightarrow {}^{14}N + \gamma.$$

Natural diamond is predominantly $^{12}C$, having $^{13}C$ in an amount of 1.11 atomic %. We used synthetic diamond produced by control vapor deposition (CVD), enriched to 99 atomic % $^{13}C$. The $^{13}C$ enriched diamond sample measured 1 mm×1 mm square and 30 μm thick with no support substrate.

The accelerator was an NEC-9SDH2 Tandem Pelletron®. The sample was positioned as the accelerator target. The system was brought to high vacuum and then the proton beam was directed onto the sample.

Beam energy was 1.90 MeV to cause doping deep (5 μm) in the diamond. Transmutation was observed using a 5"×5" CsI scintillation crystal coupled to associated counting and gating electronics. Evidence of $^{13}C$ transmutation was confirmed by observing, among others, the 9.172 MeV and 7.028 MeV gamma rays released in the reaction via radiation decay of the excited states of $^{14}N$.

After about 4 hours of doping at 1 μA of current, the sample was removed and visually inspected to assess damage and viability for long term beam bombardment. The sample had a striking royal blue tint but was otherwise mechanically intact. The sample was returned to the target chamber and subjected to the proton beam for another 40 hours. The sample was then removed and a black circular region corresponding with the mask was observed with a microscope. The black circular region was determined to be end of range damage 20 microns into the diamond, due primarily to thermal effects.

Raman spectroscopy was performed on the sample at different depths and different locations on the sample, including virgin/clear regions and doped/black regions. A Spectraphysics® argon ion laser at 514.5 nm was the excitation source. Laser intensity at the sample was about 50 mW focused to about 40 μm at the sample. The scattered light was filtered with a Kaiser Optical Systems, Inc. holographic notch filter and was collected by a Jobin Yvon U10000 spectrometer. Raman spectra recorded from analysis of the sample are shown in FIG. 1 with frequency plotted on the ordinate against relative intensity on the abscissa. Raman spectrum for the doped $^{13}C$ sample is reported as spectrum 20. Raman spectrum for the original $^{13}C$ before doping is reported as spectrum 10. Raman spectrum for a natural, $^{12}C$, diamond sample is reported as spectrum 30.

By comparison of the Raman spectra, the high quality of the undoped $^{13}C$ was evident. No $^{12}C$ signal was seen in the $^{13}C$ spectrum and only a 1281 cm$^{-1}$ line was observed. A much broader line near 1332.5 cm$^{-1}$ was visible in the natural diamond spectrum 30, but not in the doped sample spectrum 20. The Raman spectrum from the doped region of the $^{13}C$ also showed the 1281.2 cm$^{-1}$ peak little changed in full width at half maximum (FWHM) and in frequency when compared to the virgin region as it overlays it completely. However, there is a new broader peak near 710 cm$^{-1}$ which may be due to amorphous carbon/structural disorder or to carbon-nitrogen bond vibration frequencies. A tiny peak near 1425 cm$^{-1}$ may be due to linear C—N vibration modes.

Junctions were calculated to have a thickness of about 10 nm.

Example 2

A Raman spectrum was also taken on a natural diamond for comparison, reported as spectrum 30 in FIG. 1. A much broader line near 1332.5 cm$^{-1}$ was observed.

The foregoing discussion discloses and describes embodiments of the invention by way of example. One skilled in the art will readily recognize from this discussion, that various changes, modifications and variations can be made therein without departing from the spirit and scope of the invention as defined in the following claims.

What is claimed is:

1. A method of doping a wide-band gap semiconductor material comprising the steps of:
   a. selecting a wide-band gap semiconductor material comprising a crystal lattice, wherein the selected material is diamond;
   b. directing a beam of protons onto the selected material, the beam of protons having an energy sufficient to transmute an atom in the crystal lattice and in the range of 0.5 to 4.0 Mev, and for a time sufficient, to form a junction; and
   c. annealing to produce a doped semiconductor.

2. The method of claim 1 wherein the wide-band gap semiconductor material is $^{13}$C diamond.

* * * * *